ELECTRICAL CIRCUIT CAPABLE OF OSCILLATING IN A PLURALITY OF DIFFERENT FREQUENCY REGIONS COMPRISING A PLURALITY OF CAPACITIVE DIODES

Filed Oct. 27, 1967 4 Sheets-Sheet 1

Inventor:
Ernst Klettke
By: Spencer & Kaye
Attorneys

Inventor:
Ernst Klettke
By: Spencer & Kaye
Attorneys

March 10, 1970 E. KLETTKE 3,500,265

ELECTRICAL CIRCUIT CAPABLE OF OSCILLATING IN A PLURALITY OF DIFFERENT FREQUENCY REGIONS COMPRISING A PLURALITY OF CAPACITIVE DIODES

Filed Oct. 27, 1967 4 Sheets-Sheet 3

Inventor:
Ernst Klettke
By: Spencer & Kaye
Attorneys

Inventor:
Ernst Klettke
By: Spencer & Kaye
Attorneys

United States Patent Office
3,500,265
Patented Mar. 10, 1970

3,500,265

ELECTRICAL CIRCUIT CAPABLE OF OSCILLATING IN A PLURALITY OF DIFFERENT FREQUENCY REGIONS COMPRISING A PLURALITY OF CAPACITIVE DIODES

Ernst Klettke, Hannover, Germany, assignor to Telefunken Patentverwertungsgesellschaft m.b.H., Ulm, Danube, Germany Filed Oct. 27, 1967, Ser. No. 678,653
Claims priority, application Germany, Nov. 7, 1966, T 32,458
Int. Cl. H03j *3/06*
U.S. Cl. 334—15 7 Claims

ABSTRACT OF THE DISCLOSURE

The present invention relates to tuning devices for large frequency ranges or separate frequency ranges, comprising capacity diodes attached to an inductor which remains unchanged when the device is being tuned. There are connected to the inductor by means of said diodes additional reactances for achieving predetermined frequency ranges so that a diode being switched to a conducting condition is shunting the relevant additional reactances whereas another diode being switched to a non conducting condition thereby tuning a resonant circuit consisting of the inductor, the non conducting diode and additional reactances relevant to said diode. By means of a switch the conditions for said diodes are interchangeable.

The present invention relates to an electrical circuit using capacity diodes, and more particularly, to a circuit resonating in different frequency ranges, such as several television frequency band in the VHF and UHF range.

In resonant circuits tuned by non conducting capacity diodes it is known to switch the diodes from the non conducting condition into a conducting condition for changing from one frequency range to another frequency range. As the tuned frequency in all ranges always is given by a resonant circuit having an unchanged induction and changed capacities, the LC-ratio of the resonant circuit is different in different frequency ranges.

SUMMARY OF THE INVENTION

It is an object of the invention to provide a new and improved tuned circuit arrangement using capacity diodes.

Another object of the invention is to provide a new and improved tuned resonant circuit arrangement using capacity diodes wherein an inductance of the resonant circuit is used for different frequency ranges and wherein the mean value of the LC-ratio of the resonant circuit remains unchanged for all frequency ranges. These objects and others ancillary thereto are accomplished in accordance with preferred embodiments of the invention wherein there is provided an electrical circuit capable of oscillating in a plurality of different frequency regions, comprising in combination (a) a resonant circuit including a first inductor (b) a plurality of capacity diodes arranged in series with said inductor, the first of said capacity diodes being selected to resonate with the inductance of said inductor in a first preselected frequency region and the second of said diodes being selected to resonate with said inductance in a second and different preselected frequency region (c) additional reactances connected to one or both of said capacity diode(s) for achieving a predetermined frequency region when said capacity diode is switched to an non conducting condition, which reactances are shunted for high frequencies when said diode is switched to a conducting condition (d) switch means having first and second positions in the first position of which a fixed voltage is applied to said first diode for placing the same in conductive condition and a variable tuning voltage is applied to said second diode, and in the second position of which the voltages to said first and second diodes are interchanged.

BRIEF DESCRIPTION OF THE DRAWINGS

Additional objects and advantages of the present invention will become apparent upon consideration of the following description when taken in conjunction with the accompanying drawings in which.

DESCRIPTION OF THE PREFERRED EMBODIMENTS

Figure 1:
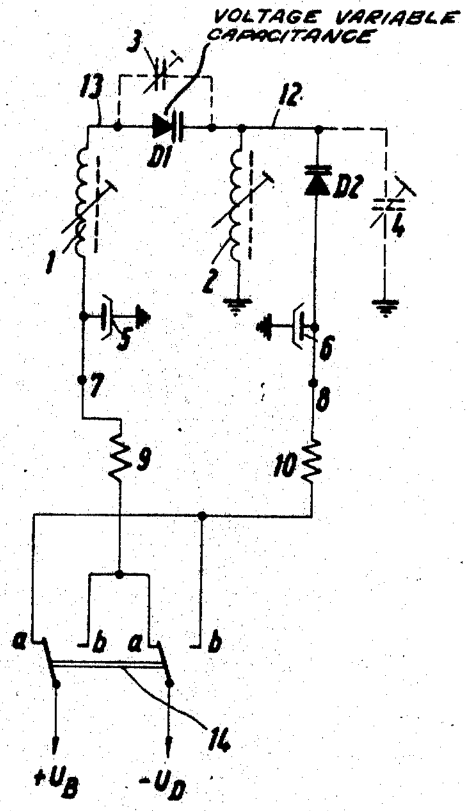
FIG. 1 is an electrical schematic diagram illustrating the present invention when used for operation in two frequency ranges.

Referring to the drawings and, more particularly, to FIG. 1, the resonant circuit inductance is represented by the inductor 1. For alternating circuits one end of the inductor 1 is connected to a reference potential such as ground via a condenser 5 while the other end is connected to one electrode of a capacity diode D1. The other electrode of the diode D1 being connected to one electrode of a capacity diode D2 the other electrode of which is connected via a condenser 6 to a reference potential such as ground. The connection 12 of both diodes D1, D2 is connected to one end of an inductor 2 the other end of which is also connected to the reference potential. There may be connected if necessary in parallel to the diodes D1, D2 condensers 3, 4 drawn in dashed lines. A fixed voltage $+U_B$ and a variable voltage $-U_D$ are applied via a switch 14 and terminals 7, 8 to the diodes D1, D2 so that one diode D2 is conducting while the other diode D1 is non-conducting or vice versa. For ensuring that the diodes do not rise above the desired values (e.g. 50 ma.) there are connected in series to the diodes resistors 9 and 10. Switch 14 diagrammatically illustrated, is a double pole, double throw switch which, in one position connects terminal 7 to the variable voltage $-U_D$ and terminal 8 to the fixed voltage $+U_B$, which in its other position *b* terminals 7 and 8 are exchanged.

Figure 2:
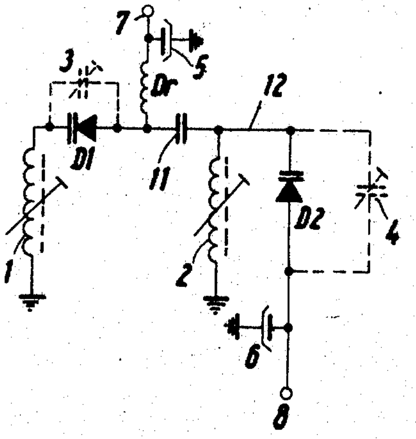
FIG. 2 is an electrical schematic diagram wherein the switching voltage is applied to the capacity diodes different from that shown in FIG. 1.

Referring now to FIG. 2 the circuit arrangement is identical in terms of high frequency with that of FIG. 1. Only the voltages $+U_B$ and $-U_D$ are now being applied to the diode D1 via a high-frequency choke $D_r$ and the lower end of the inductor 1 is directly connected to ground. Moreover, the direct current paths for the diodes are separated by a large capacitor 11, which in terms of high frequency is a short circuit. The direct voltage supply for the terminals 7, 8 is connected in the same way exactly as in FIG. 1.

Figure 3A:
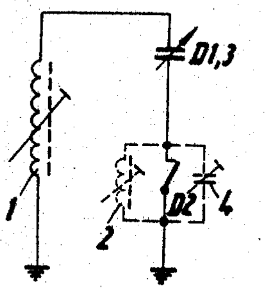
FIG. 3*a* shows an equivalent diagram for the circuits according to FIGS. 1 and 2 when operating in a first frequency range.
Figure 3B:
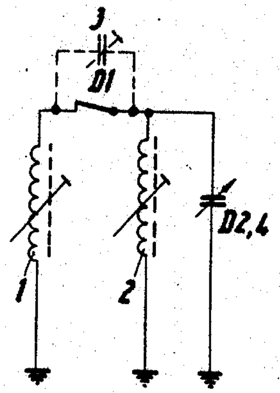
FIG. 3*b* shows an equivalent diagram for the circuits according to FIGS. 1 and 2 when operating in a second frequency range.

In the case of the circuit ararngements of FIGS. 1 and 2 the following two operating conditions are adjustable. The high frequency equivalent circuit for this practical case in the lower frequency band is shown in FIG. 3*a*. The high frequency equivalent circuit for this practical case in the upper frequency band is shown in FIG. 3*b*. For operation in the lower frequency band, the switch 14 is in the position "*a*" which position is shown in FIG. 1. The diode D2 which is now conducting connects point 12 in terms of high frequency to earth. Therefore the inductance 2 and the trimmer capacity 4 are shunted the same time by the conducting diode D2. The diode 1 is blocked so that it is operated as capacity. Its capacity which is variable by means of the variable blocking voltage $-U_D$ forms together with the trimmer capacity 3 and the inductance 1 the resonant circuit. The elements are selected so that it is effective in the lower frequency band. The effective reactances are formed by the inductance 1, the variable blocking capacity of the diode D1 and by any trimmer capacity 3 which is present. The other reactances 3, 4 which are shown in pecked lines are short circuited against earth by the conducting diode D2 which is drawn as a closed switch.

For operation in the upper frequency band, the switch 14 is in the position *b*. The diode D1 is thus conducting, the trimmer capacity 3 is short-circuited, points 12, 13 are connected directly with one another in terms of high frequency. The diode D2 is blocked. Its capacity which is variable by means of the blocking voltage $-U_D$ now forms together with the trimmer capacity 4 and the inductances 1, 2 connected parallel the resonant circuit which is effective in the upper frequency band. The effective reactances are formed by the variable blocking capacity of the diode D2 and any trimmer capacity present and by the parallel connected inductances 1, 2. The latter are connected at their top points 12, 13, as the diode D1 which is drawn as a closed switch is conducting. In this way the trimmer capacity 3 is also ineffectual.

The circuit arrangement according to FIGURES 1 and 2 has been proved with good results whereby diodes of the following capacity values have been used. When supplied with blocking voltages between 2 and 50 volts the diode D1 varies its capacity from 20–7 pf. The capacity of the diode D2 varies with the same blocking voltage values between 8 and 3 pf.

Figure 4:
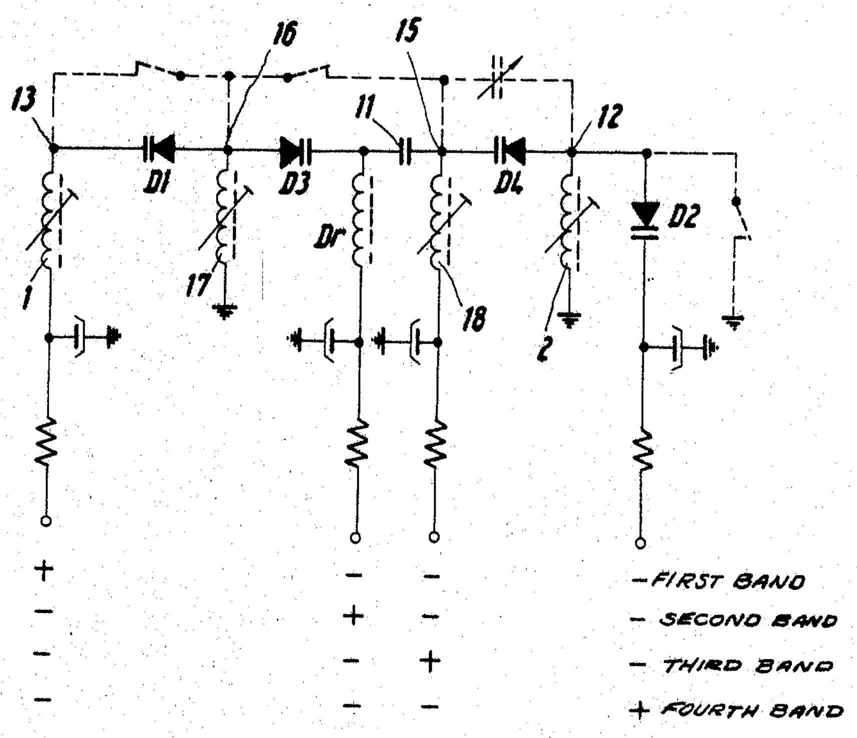
FIG. 4 is an electrical schematic diagram illustrating the invention when used for operation in four frequency ranges.

In FIG. 4 the circuit principle useds in FIGS. 1 and 2 for two frequency ranges has been extended to four frequency ranges, but all the additional trimmer capacities have not been entered for reasons of clarity. Between the anode of the diode D1 and the point 12 two further capacity diodes D3, D4 are connected in series. Its connecting points 15 and 16 are connected to earth via two further inductances 17, 18. The polarity of the diode arrangement is in principle without significance; care must only be taken to see that there are separate direct current paths for all the diodes. For one frequency band, only one capacity diode is non conducting while all the other diodes are conducting. From the polarity of the voltages given in the table in FIG. 4 it can easily be seen which capacity diode is associated with which of the four frequency bands. The dashed lines which have been entered into FIG. 4 illustrate the operating conditions for the third band: the diodes D1, D2 and D3 are conducting and the diode D4 is nonconducting. In this way points 13, 15 and 16 are connected directly with one another and point 12 is earthed for high frequency currents. The resonant circuit therefore contains the variable blocking capacity of the diode D4 and the parallel connected inductances 1, 17 and 18. The capacity diodes and any parallel connected additional capacities are generally selected so that the LC-ratio of the oscillating circuit is approximately constant in all frequency bands.

Figure 5A:
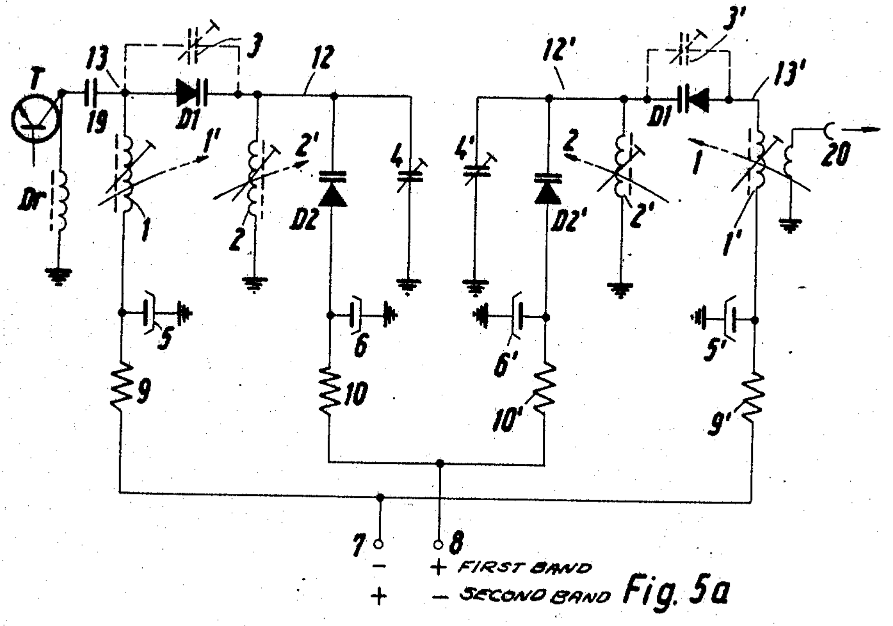
FIG. 5*a* is an electrical schematic diagram illustrating an embodiment of the invention using double tuned bandpass filters.

In FIG. 5*a* a double tuned pass-band filter is represented which is intended for two frequency bands, e.g. for a lower and a higher band. The two resonant circuits and the references of the components correspond to the circuit arrangement according to FIG. 1. The references of the second circuit are additionally characterised especially by apostrophe. The input of the band-pass filter is formed by terminal 13 fed via a coupling capacity 19 by an amplifier T. The output is connected via a terminal 20 to a following amplifier stage or a mixer (not shown).

Figure 5B:
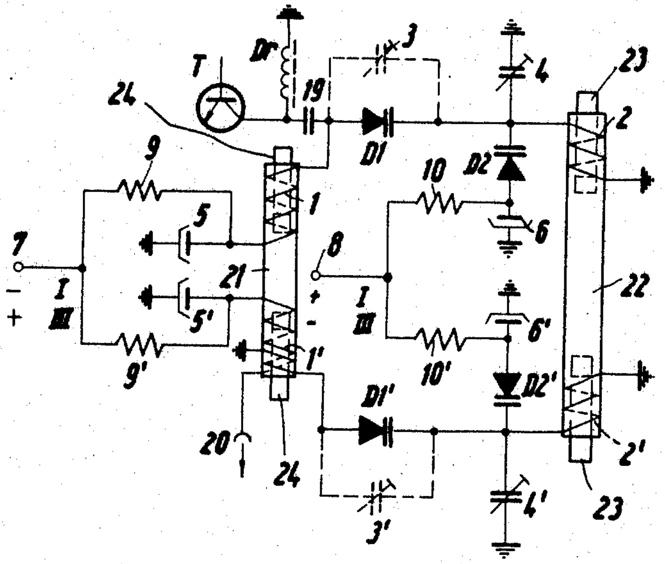
FIG. 5*b* is an practical combination for a circuit according to FIG. 5*a*.

FIG. 5*b* shows a practical construction of the circuit arrangement according to 5*a*. The inductive coupling of the bandpass filter circuits is obtained by two pairs of inductors 1/1′ and 2/2′ being attached respectively to winding formers 21, 22. In the lower frequency band, only the coupling between the inductors 1 and 1′ is effective, as the inductors 2 and 2′ are short-circuited by means of the conducting diodes D2, D2′. In the upper frequency band there are couplings between the inductors 1 and 1′ and between the inductors 2 and 2′. The inductors 1/1′ and 2/2′ can be matched by compensating cores 23, 24.

Figure 6:
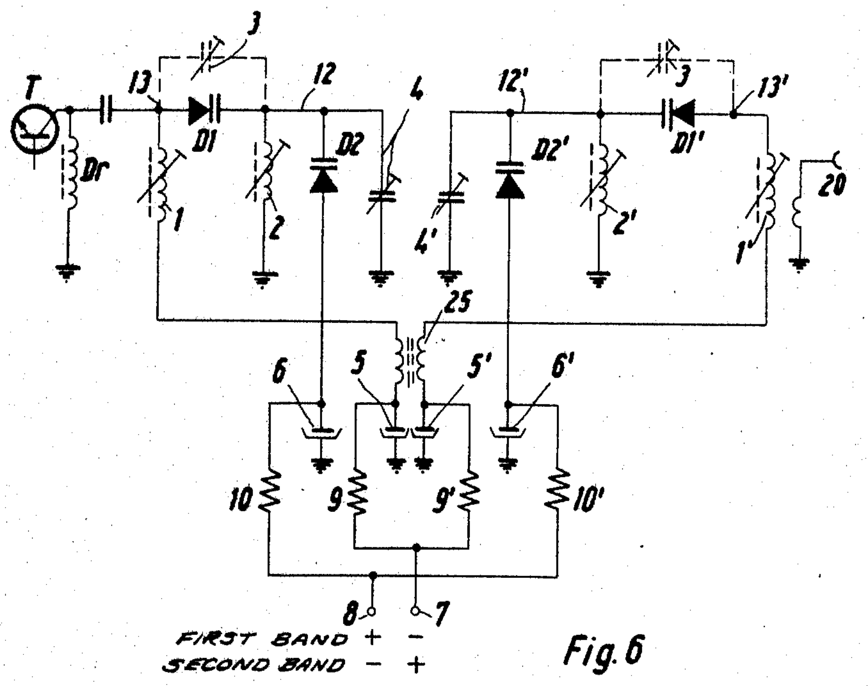
FIG. 6 is a further embodiment of the invention similar to FIG. 5*a*.

The circuit arrangement according to FIG. 6 corresponds, apart from the coupling of the circuits, exactly to that of FIG. 5*a*. Here, a coupling 25 between parts of the inductors 1 and 1′ only effectual in the lowest frequency band is selected so that in all the frequency bands approximately the same pass-band width is adjusted if in higher frequency bands further inductors (2, 2′) are connected in parallel.

Figure 7:
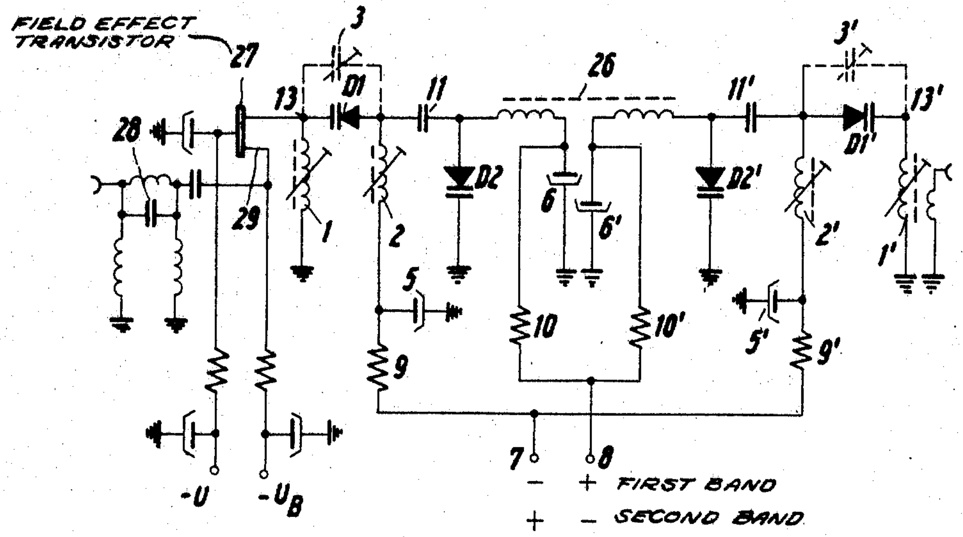
FIG. 7 is an embodiment of the invention using a field effect transistor.

Principally, both circuits of the band-pass filter in the circuit arrangement according to FIG. 7 correspond to the circuit arrangement according to FIG. 2, except for the direct voltage supply for the diodes D1, D1′, D2, D2′. As in FIG. 6, both band-pass filter circuits are coupled by inductors 26 being effective in both frequency bands and having similar properties as the coupling 25 in FIG. 6. The input B of this band-pass filter is connected to a field effect transistor 27, whose source electrode is connected via a high-pass network 28 to the input terminal. Instead of the field effect transistor 27 it is generally possible to use an amplifier unit, whose slope in all frequency bands has approximately the same value.

It will be understood that the above description of the present invention is susceptible to various modifications, changes and adaptations.

What is claimed is:

1. An electrical circuit capable of oscillating in a plurality of different frequency regions, comprising in combination (a) a resonant circuit including a first inductor (b) a plurality of capacity diodes arranged in series with said inductor, the first of said capacity diodes being selected to resonate with the inductance of said inductor in a first preselected frequency region and the second of said diodes being selected to resonate with said inductance in a second and different preselected frequency region (c) additional reactances connected to at least one of said capacity diodes for achieving a predetermined frequency region when said capacity diode is switched to a non conducting condition, which reactances are shunted for high frequencies when said diode is switched to a conducting condition (d) switch means having first and second positions, in the first position of which a fixed voltage is applied to said first diode for placing the same in conductive condition and a variable tuning voltage is applied to said second diode, and in the second position of which the voltages to said first and second diodes are interchanged.

2. An electrical circuit in accordance with claim 1 wherein said additional reactances comprise a second inductor connected in series with said first diode and said first inductor and connected in parallel to said second diode.

3. An electrical circuit in accordance with claim 1 wherein said additional reactances comprise capacities connected in parallel to said first and second diodes.

4. An electrical circuit according to claim 1 wherein the capacitance of the first and second capacity diodes are selected to have different values.

5. An electrical circuit according to claim 1 wherein the capacitances of the first and second capacity diodes and the additional reactances are selected so as to provide a resonant circuit having in every frequency range the same LC-ratio.

6. An electrical circuit according to claim 1 wherein the resonant circuit is part of a pass-band filter and the additional reactances are selected so as to provide the same coupling in every frequency range.

7. An electrical circuit capable of oscillating in a plurality of different frequency regions, comprising in combination:

(a) a plurality of capacity diodes, the first of said capacity being selected to co-operate with the inductance of a resonant circuit in a first preselected frequency region and the second of said diodes being selected to co-operate with the inductance of said resonant circuit in a second and different preselected frequency region.

(b) additional reactances effectively connected to said inductance by at least one of said capacity diodes for achieving a predetermined frequency region when said capacity diode is switched to a non conducting condition, which reactances are shunted for high frequencies when said diode is switched to a conducting condition, (c) switch means having first and second positions in the first position of which a fixed voltage is applied to said first diode for placing the same in conductive condition and a variable tuning voltage is applied to said second diode, and in the second position of which the voltages to said first and second diodes are interchanged.

References Cited

UNITED STATES PATENTS 3,103,637 9/1963 Pan ---------------- 334—15 X

FOREIGN PATENTS 1,196,730 7/1965 Germany.

HERMAN KARL SAALBACH, Primary Examiner

PAUL L. GENSLER, Assistant Examiner

U.S. Cl. X.R.

334—55; 307—320